United States Patent [19]
Lakkapragada et al.

[11] Patent Number: 5,898,618
[45] Date of Patent: Apr. 27, 1999

[54] ENHANCED BLANK CHECK ERASE VERIFY REFERENCE VOLTAGE SOURCE

[75] Inventors: Shankar Lakkapragada, San Jose; Derek R. Curd, Fremont, both of Calif.

[73] Assignee: Xilinx, Inc., Logic Drive, Calif.

[21] Appl. No.: 09/012,677

[22] Filed: Jan. 23, 1998

[51] Int. Cl.$^6$ .................................................. G11C 16/06
[52] U.S. Cl. ................. 365/185.22; 365/185.23; 365/185.29; 327/530; 327/538; 327/543
[58] Field of Search ......................... 365/185.22, 185.23, 365/185.29; 327/530, 538, 543

[56] References Cited

U.S. PATENT DOCUMENTS

| | | | |
|---|---|---|---|
| 5,561,631 | 10/1996 | Curd ................................... | 365/185.22 |
| 5,650,672 | 7/1997 | Curd ....................................... | 307/130 |
| 5,661,685 | 8/1997 | Lee et al. ............................. | 365/185.22 |

OTHER PUBLICATIONS

"The Programmable Logic Data Book", 7/1996, published by Xilinx Inc., 2100 Logic Drive, San Josee, CA, 95124, pp. 3–71 to 3–78.

Primary Examiner—David Nelms
Assistant Examiner—Andrew Q. Tran
Attorney, Agent, or Firm—Patrick T. Beaver; Bever & Hoffman; Jeanette S. Harms

[57] ABSTRACT

A programmable logic device (PLD) performs a self-test blank check erase verify operation on memory elements of the PLD to verify that they are erased prior to programming. An enhanced reference voltage source is provided to reliably generate a reference source voltage at a predetermined voltage level regardless of variations in the on-chip power supply voltage and temperature variations. The reference voltage source includes a first resistor connected between the on-chip voltage source and an output node, a second resistor connected to the output node, and a reference voltage adjustment circuit connected between the second resistor and ground. The reference voltage adjustment circuit is programmable to selectively connect the output node to ground through one or more resistive elements in response to input signals such that the output node is maintained at the predetermined reference voltage. The first and second resistors form a resistive divider that allows the predetermined reference voltage to track changes in the on-chip voltage source.

15 Claims, 6 Drawing Sheets

ENHANCED BLANK CHECK ERASE VERIFY REFERENCE VOLTAGE SOURCE

FIELD OF THE INVENTION

The present invention relates to programmable logic devices (PLDs), and more particularly to methods for checking memory cell states in programmable logic devices.

BACKGROUND OF THE INVENTION

A programmable logic device (PLD) is an integrated circuit that is purchased by a user in an unprogrammed state, and then programmed by the user to implement the user's circuit design. PLDs typically include blocks of logic elements and interconnect resources that are programmably controlled by associated memory cells. PLDs are typically programmed using a device programmer and place-and-route software installed in a personal computer or workstation. The user enters the circuit design and information regarding a target PLD into the computer/workstation. The place-and-route software then "maps" the user's circuit design by assigning portions of the circuit design to selected logic element blocks of the target PLD, and assigning signal paths (nets) linking the portions to selected interconnect resources. A mapping solution is then generated that contains information regarding the on/off states of all memory cells of the target PLD. Some PLD types are programmed with the mapping solution by being placed on the device programmer and transmitting the mapping solution into the PLD from a computer/workstation through the device programmer. In other PLD types, the mapping solution is downloaded to a read-only-memory (ROM) that is accessed by configuration logic of the PLD during start-up. In addition, some PLDs are in-system programmable (ISP) in that they are programmed via serial interface after, for example, being soldered to a printed circuit board (PCB). In each PLD type, the mapping solution is utilized to configure the memory cells of the target PLD such that the target PLD implements the user's circuit design.

Several types of PLDs are currently available, including field programmable gate arrays (FPGAs) and complex programmable logic devices (CPLDs). FPGAs typically include logic element blocks that are arranged in a matrix and separated by rows and columns of interconnect lines. In contrast, CPLDs typically include logic element blocks that receive input signals from a central interconnect matrix. The present application is primarily directed to CPLDs, but may also utilized in FPGAs and other types of PLDs.

FIG. 1 is a simplified block diagram showing circuitry utilized in some known CPLDs. In particular, FIG. 1 shows an interconnect matrix 100, a blank check circuit 150 and a multi-level voltage source 200.

Interconnect matrix 100 includes columns of first conductors (referred to as wordlines) 110 that are driven by wordline drivers 115, rows of second conductors (referred to as bitlines) 120 that are connected to sense amplifiers 125, and an array of memory cells 130 located between adjacent wordlines 110 and bitlines 120. Wordlines 110 transmit device input signals and feedback signals into interconnect matrix 100. The voltage level of high voltage signals transmitted on wordlines 110 is determined by multi-level voltage source 200. Bitlines 120 are normally maintained at less than system voltage (<Vcc) using relatively weak pull-up devices, and are pulled down when an associated memory cell 130 is turned on. An associated sense amplifier 125 amplifies the voltage level on each bitline 120 (which may vary by tens of millivolts). Each sense amplifier 125 generates a full logic level output signal in accordance with the sensed voltage level. The sense amplifier output signals are transmitted to associated PLD logic, and are also transmitted to blank check circuit 150. Memory cells 130 are typically implemented by re-writable read-only memories (ROMs), such as EPROMs, EEPROMs, flash EPROMs, or flash EEPROMs. Each memory cell 130 includes a control gate connected to a wordline 110, a source connected to a bitline 120, and a drain tied to ground. Each memory cell 130 also includes a floating gate that is programmed/erased by charging/discharging the floating gate using, for example, hot electron injection or electron tunneling. When erased, a memory cell 130 is turned on/off by an associated high/low wordline voltage. Conversely, when programmed, a memory cell 130 is not turned on (i.e., remains turned off) in response to high and low wordline voltage. For example, when memory cell 130(11) is erased, a high voltage on wordline 110(1) turns on memory cell 130(11), thereby connecting the source of memory cell 130(11) to ground and pulling down the voltage on associated bitline 120(1). In contrast, when programmed, memory cell 130(11) remains turned off even if a high wordline voltage signal is generated on wordline 110(1), and associated bitline 120(1) remains high.

Wordlines 110 must be driven at different voltage levels during different operation modes of interconnect matrix 100. By way of example, a voltage level of 10 to 12 volts may be required on wordline 110(1) to program memory cell 130(11), a voltage level of approximately 0 volts may be required to erase memory cell 130(11), and a voltage level of 5 volts may be required during normal operation. In addition, a voltage level of 7 to 8 volts may be used to verify that memory cell 130(11) is programmed, and a voltage level of 3 volts may be used to verify that memory cell 130(11) is erased. These various voltage levels are provided by multi-level voltage source 200.

Memory cell erase verification is performed after all of memory cells 130 of a PLD are erased, which is necessary before the PLD is programmed with a user's circuit design. The PLD may be erased by exposing it to ultraviolet light (e.g. standard UV EPROMs), or may be erased electrically (e.g. flash EPROMs and EEPROMs). With either method, a memory cell erase verification process (referred to herein as a blank check operation) is required to ensure that the erase cycle was successful in completely erasing all of the memory cells 130. A blank check operation is performed, for example, by sequentially applying a reference voltage of 3 volts to each wordline 110, and monitoring the resulting voltage levels on bitlines 120 using blank check circuit 150 in the manner described below. The reference voltage is selected to turn on fully-erased memory cells 130, but insufficient to turn on memory cells 130 that are not fully erased. For example, if the 3 volt reference voltage is applied to wordline 110(1) and memory cells 130(11), 130(21) . . . 130(n1) are fully erased, then all of the bitlines 120(1) through 120(n) will be pulled low. Conversely, if, for example, memory cell 130(11) is not fully erased, then bitline 120(1) will remain high when the reference voltage is applied to wordline 110(1). During the blank check operation, the high and low voltages on bitlines 120(1) through 120(n) are transmitted through sense amplifiers 125(1) through 125(n) to the blank check circuit 150.

As shown in FIG. 1, blank check circuit 150 includes a PMOS device P1 and parallel-connected NMOS devices N(1) through N(n). PMOS device P1 has a drain connected to a common node 155, a source connected to Vcc, a gate connected to ground, and is sized to provide a weak pull-up on common node 155. Each NMOS device N(1) through N(n) has a drain connected to common node 155 and a source connected to ground. In addition, each NMOS device N(1) through N(n) has a control gate connected to the output of an associated sense amplifier 125(1) through 125(n).

During a blank check operation, NMOS devices N(1) through N(n) remain turned off (common node 155 remains at a high voltage level) unless one or more of memory cells 130 are not fully erased, in which case at least one of NMOS devices N(1) through N(n) is turned on (common node 155 is pulled down). For example, if the reference voltage is applied to wordline 110(1) and memory cell 130(11) is not fully erased, then bitline 120(1) remains at a high voltage level. The high voltage level on bitline 120(1) is transmitted through sense amplifier 125(1) to the control gate of NMOS device N(1), thereby turning on NMOS device N(1) and pulling down common node 155. The low voltage level on common node 155 is detected by monitoring circuit 170, which notifies the user that the PLD is not fully erased. Therefore, blank check circuit 150 allows a simultaneous blank check of all memory cells 130 associated with a wordline 110 of interconnect matrix 100 by bringing the wordline 110 under test to the predetermined reference voltage while keeping all other wordlines at a low voltage.

FIG. 2 is a simplified block diagram showing an example of multi-level voltage source 200 that is connected to wordlines 110 through wordline drivers 115. Multi-level voltage source 200 includes a power multiplexer (power MUX) 210 that receives reference voltages from a 12 volt source 220, an 8 volt source 230, a 5 volt source 240, and a 3 volt reference voltage source 300, and also receives two or more control signals 260. In response to control signals 260, power MUX 210 transmits either a 12 volt signal, an 8 volt signal, a 5 volt signal, a 3 volt signal, or a 0 volt signal to wordline drivers 115 via output line 270. Reference voltages (such as the 3 volt reference voltage) are transmitted through a pass transistor in power MUX 210, and are therefore subjected to a threshold voltage drop of approximately 0.7 volts, and up to 2 volts (depending on body effect). Therefore, the voltage sources providing these reference voltages must transmit an input voltage that is approximately one threshold voltage drop above the required reference voltage.

In order to account for the voltage drop introduced by power MUX 210, reference voltage source 300 generates an output voltage of 3.5 to 4 volts. If the output voltage generated by reference voltage source 300 falls below the range of 3.5 to 4 volts, then the reference voltage applied to wordlines 110 may not be sufficient to turn on memory cells 130 (FIG. 1), even if they are properly erased. As a result, blank check circuit 150 may incorrectly indicate that a CPLD is not fully erased, thereby causing the user to repeat the erase procedure or incorrectly assume the PLD has a defective memory cell. For example, a typical memory cell 130 may have an erased threshold voltage Vth(er) of 2.5 volts. If reference voltage source 300 generates an output voltage of, for example, 3 volts, then the reference voltage applied to the memory cell will be approximately 2.3 volts. Because the reference voltage is below Vth(er), the memory cell may not turn on during a blank check operation, and the blank check operation may incorrectly indicate that one or more memory cells 130 are not erased. Incorrect blank check results may frustrate users, which can result in a loss of sales by the CPLD manufacturer. Therefore, it is important for reference voltage source 300 to adjust to variations in Vcc to produce a reliable 3.5 to 4 volt reference voltage.

FIG. 3 is a circuit diagram illustrating prior art reference voltage source 300 that includes programmable circuitry used to adjust for variations in process parameters such that a reliable 3.5 to 4 volt output voltage is generated for use during the blank check operation. Such variations in process parameters commonly arise during the production of CPLDS. For example, if a CPLD is designed to operate on a nominal Vcc of 5 volts (within a 4.5 to 5.5 volt range), then differences in fabrication process parameters may produce a reference voltage from source 300 in the range of 3.0 to 4.5 volts. To adjust for these variations, reference voltage source 300 is provided with programmable circuitry that is selectively utilized to "trim" the output voltage to the required 3.5 to 4 volt level.

Referring to FIG. 3, reference voltage source 300 includes a PMOS device P(31) that connects node 310 to Vcc, and programmable circuitry including several resistance paths that are controlled by control signals 320 to selectively connect node 310 to ground. An associated NMOS device N(31) through N(34) selectively controls each resistance path, and has a different resistance value that is determined by the particular NMOS resistance elements NR(31) through NR(37) located on that path. The resistance paths are selectively connected to node 310 NMOS devices N(31) through N(34), which are controlled by memory cells (not shown) that generate control signals transmitted on lines 320(1) through 320(4). For example, a first resistance path including resistance element NR(31) is connected between node 310 and ground by control signal 320(1) that is applied to the gate of NMOS device N(31). NMOS device N(32) is selectively turned on by control signal 320(2) to connect node 310 to ground along a second path including resistance element NR(32). NMOS device N(33) is selectively turned on by control signal 320(3) to connect node 310 to ground along a third path including serially-connected resistance elements NR(33) and NR(34). Finally, NMOS device N(34) is selectively turned on by control signal 320(4) to connect node 310 to ground along a fourth path including serially-connected resistance elements NR(35), NR(36) and NR(37). Each resistance element NR(31) through NR(37) is an NMOS device having a commonly-connected source and gate, and has a resistance value determined by the size (width and length) of the NMOS device. By controlling the size of each resistance element, the resistance paths provide a variety of resistances that allow adjustment of the voltage level at node 310. For example, if resistance element NR(31) has a width-to-length ratio of 8/4 and resistance element NR(32) has a width-to-length ratio of 2.4/4 (assuming Vcc is 4.5 volts), then the voltage level at node 310 is 2.52 volts if NMOS device N(31) is selected, or 2.70 volts if NMOS device N(32) is selected. Similarly, the resistance elements of the other paths are formed to provide a variety of resistance values for a given Vcc level.

Reference voltage source 300 is typically programmed during tests performed by the CPLD manufacturer before the CPLDs are sold to a user. During these tests, an acceptable range for source 300 is determined, a resistance path is selected, and memory cells (not shown) are programmed to produce control signals necessary to connect the selected resistance path between node 310 and ground, thereby adjusting the output voltage to 3.5 to 4 volts (if possible). Because this adjustment is performed before the CPLD is purchased, this adjustment is typically "transparent" to the user.

A problem with reference voltage source 300 arises when the Vcc power supply of a CPLD is at its minimum value (e.g., at 4.5 volts). When Vcc is at this minimum value, the voltage drop across PMOS device P(31) generates an output voltage that drops below the required 3.5 volts, thereby generating a reference voltage on wordlines 110 that is significantly less that the required 3 volt reference voltage. Specifically, the reference voltage is equal to Vcc−(Vtn+Vtp), where Vtn is the voltage drop introduced by power MUX 210, and Vtp is the voltage drop across PMOS device P(31). Therefore, if Vcc is at 4.5 volts or less, then the resulting output voltage drops below 3 volts, thereby generating incorrect blank check operation results, as described above. This results is an unreliable device that the CPLD manufacturer cannot sell, thereby reducing profit.

Another problem with reference voltage source 300 arises when the CPLD is subjected Vcc fluctuations during use. Typically, the reference voltage is set for a certain Vcc at a particular temperature and process corner. When Vcc fluctuates during use, the trip voltage of the sense amplifiers 125 changes with Vcc. As Vcc drifts upward, the reference voltage must also track Vcc to prevent blank check circuit 150 from incorrectly indicating programmed memory cells.

SUMMARY OF THE INVENTION

The present invention provides an enhanced reference voltage source for generating a reliable reference source that is used to blank check a PLD. The reference voltage source utilizes a resistive divider that is less sensitive to process corners and temperature variation than a PMOS pull-up device, and is able to output a 3.5 to 4 volt reference voltage even when the Vcc of the PLD is at a minimum value.

A reference voltage source is disclosed that generates a predetermined reference voltage during a blank check operation. In accordance with a first embodiment of the present invention, the reference voltage source includes a first resistor connected between Vcc and an output node, a second resistor connected to the output node, and a reference voltage adjustment circuit connected between the second resistor and ground. The reference voltage adjustment circuit selectively connects the output node to ground through the second resistor and through one or more of a plurality of resistive elements such that a reference voltage at the output node is equal to the predetermined reference voltage.

In accordance with one embodiment, the reference voltage adjustment circuit includes a first resistive path and a second resistive path. The first resistive path is connected between the second resistor and ground, and includes a first transistor that connects the first resistive path to ground in response to a first input signal. The second resistive path is connected in parallel with the first resistive path and includes a second transistor that connects the second resistive path to ground in response to a second input signal. The reference voltage at the output node is adjusted in response to the first and second input signals that are controlled by memory cells.

In accordance with another embodiment, a plurality of resistive paths are provided between the second resistor and ground. Each resistive path includes either a different number of resistive elements having an equal resistance, or resistive elements having unequal resistances such that all of the resistance paths have different resistance values. The reference voltage at the output node is adjusted by connecting the output node to ground through the second resistor and through a selected resistance path.

DETAILED DESCRIPTION OF THE DRAWINGS

Figure 4:
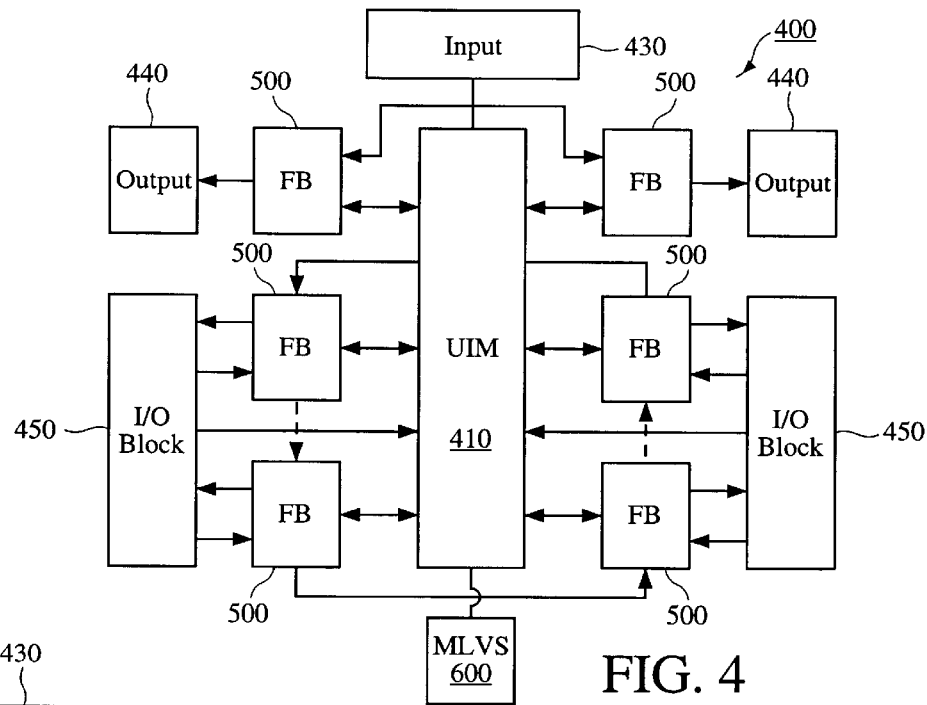
FIG. 4 is a block diagram showing programmable logic device in accordance with the present invention.

FIG. 4 is a simplified block diagram showing a PLD 400. PLD 400 includes a universal interconnect matrix (UIM) 410, two or more function blocks (FBs) 500 that transmit signals to and receive signals from UIM 410, and input circuits 430, output circuits 440 and input/output (I/O) blocks 450 that transmit signals between UIM 410, FBs 500, and external pins (not shown) of PLD 400. PLD 400 is generally consistent with products of the XC7300™ CMOS CPLD family that are produced by Xilinx, Inc. located at 2100 Logic Drive in San Jose, Calif. Additional details regarding the contents and operation of XC7300™ CMOS CPLDs are disclosed on pages 3–71 through 3–78 of The Programmable Logic Data Book (June 1996), that is available from Xilinx, Inc., which are incorporated herein by reference.

Figure 1:
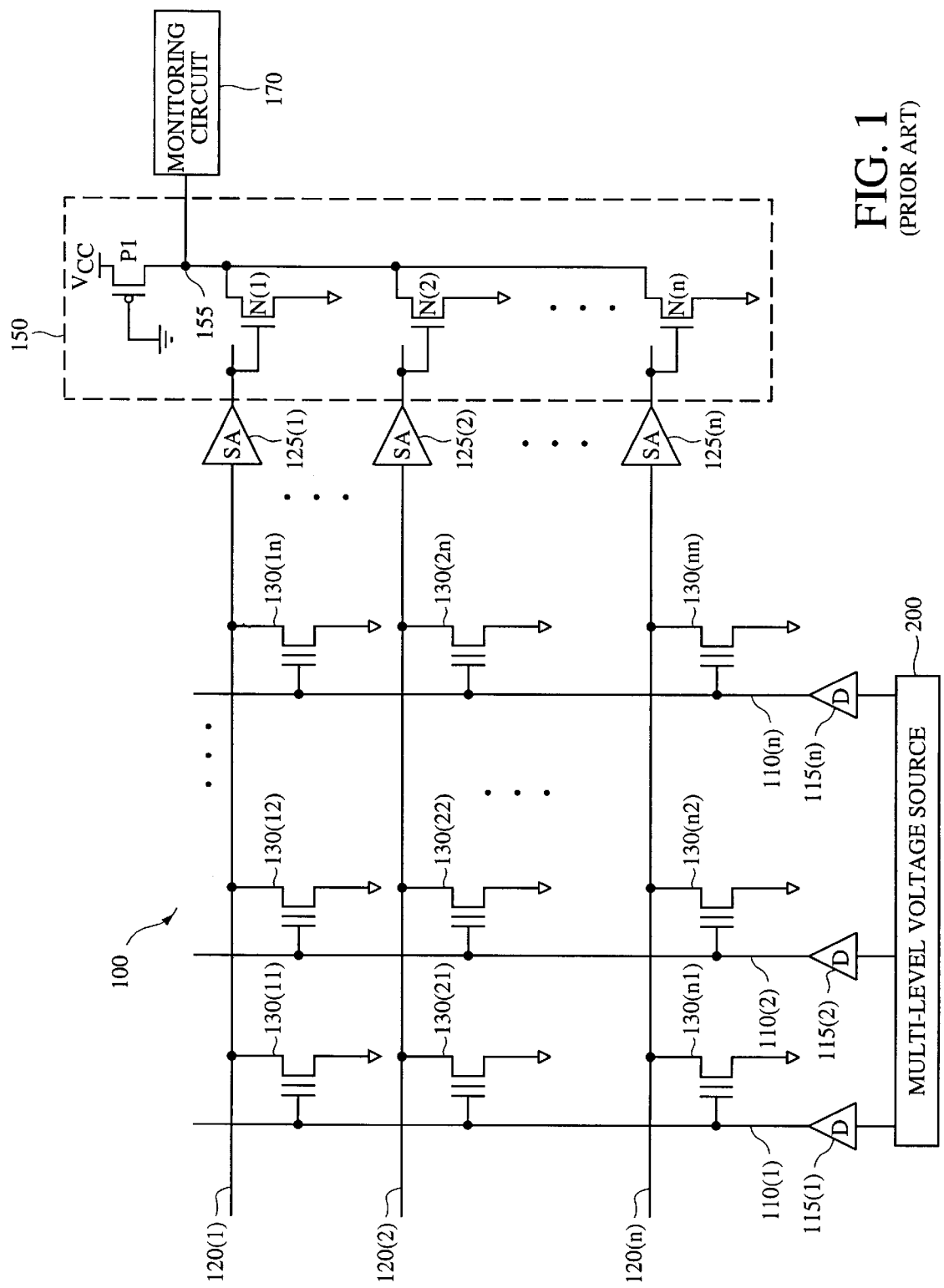
FIG. 1 is a simplified circuit diagram showing an interconnect matrix and blank check circuit for a prior art programmable logic device.
Figure 2:
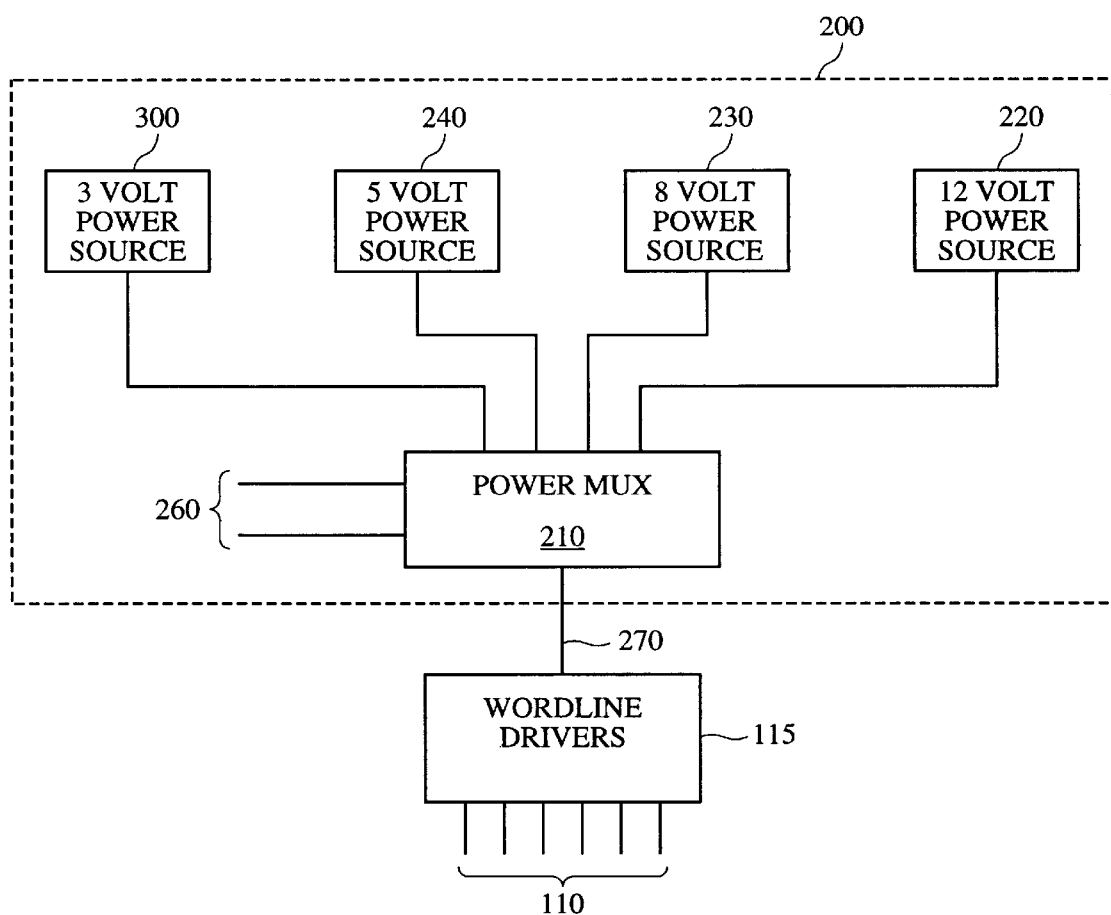
FIG. 2 is a simplified block diagram showing a multi-level voltage source for providing wordline voltages to the interconnect matrix of FIG. 1.

UIM 410 includes a structure substantially the same as that of the interconnect matrix 100 shown in FIG. 1. In particular, input and feedback signals enter UIM 410 on wordlines that are driven by wordline drivers, and are transmitted from UIM 410 to FBs 500 on bitlines having sense amplifiers. Memory cells located between adjacent wordlines and bitlines are erased/programmed such that high voltage signals transmitted on the wordlines turn on erased memory cells to connect an associated bitline to ground. As with interconnect matrix 100, the bitlines of UIM 410 are connected to a blank check circuit that is identical to blank check circuit 150 (discussed above), which is described in additional detail in U.S. Pat. No. 5,561,631 (incorporated herein by reference). In addition, the wordlines of UIM 410 are connected to a multi-level voltage source 600 (described below) in the same manner that multi-level voltage source 200 is connected to interconnect matrix 100.

Figure 5:
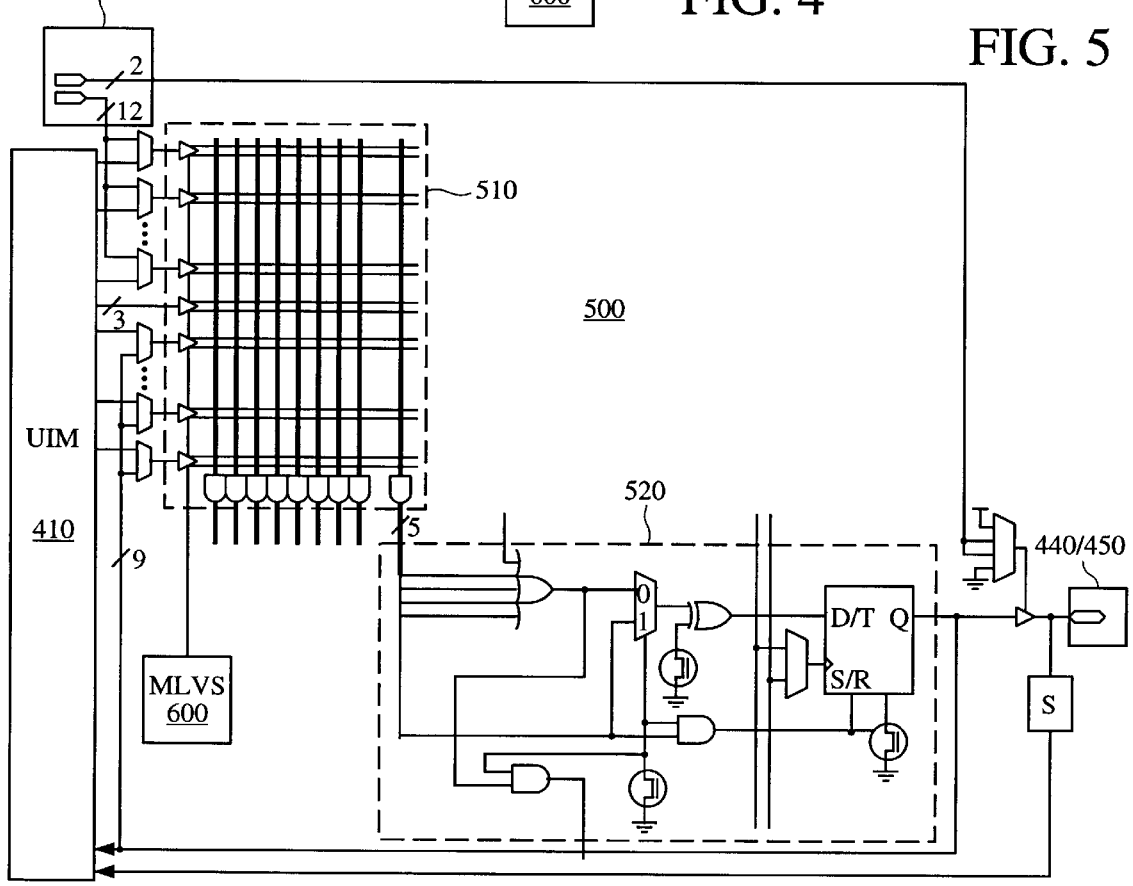
FIG. 5 is a simplified circuit diagram showing a function block of the programmable logic device of FIG. 4.

FIG. 5 is a simplified diagram showing portions of a function block 500. Function block 500 includes an AND array 510 and nine macrocells 520 (one shown). AND array 510 receives input signals from UIM 410 or input blocks 430, and/or receives signals fed back from macrocells 520. AND array outputs product terms (P-terms) that are received by macrocells 520. Each macrocell 520 includes programmable logic circuitry for implementing a logic operation based on the received P-terms, and generates an output signal. Each macrocell 520 is also programmable to receive input signals from adjacent macrocells, and to transmit signals (such as addition carry signals) to adjacent macrocells. The output signal of each macrocell 520 is passed through a flip-flop, and output enable signals are used to direct the output signal to its intended destination (i.e., as a feedback signal to AND array 510, as a feedback signal to UIM 410, or as an output signal to output block 440 or I/O block 450).

AND array 510 is similar to interconnect array 100 (described above) with input signals transmitted on true and compliment wordlines, output P-term signals transmitted on bitlines, and memory cells connected between the bitlines and wordlines. Similar to UIM 410, the wordlines of AND array 510 include drivers that generate wordline voltages in response to reference signals generated by a multi-level voltage source 600. Also, as with UIM 410 and interconnect array 100, AND array 510 includes a blank check circuit for checking the erased state of its memory cells.

Figure 6:
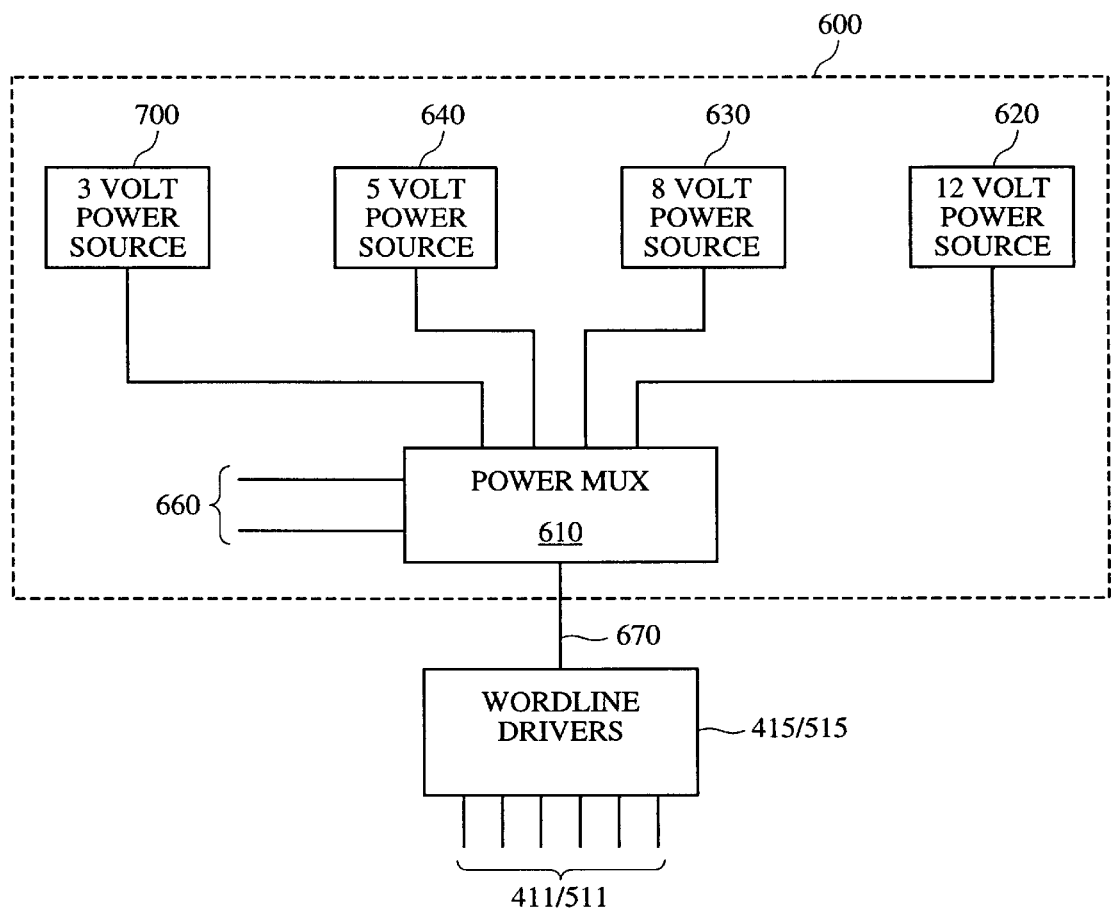
FIG. 6 is a simplified block diagram showing a multi-level voltage source of the programmable logic device of FIG. 4.

FIG. 6 is a simplified block diagram showing an example of multi-level voltage source 600 that is connected to wordlines 411 of UIM 410 and/or wordlines 511 of AND array 510 through wordline drivers 415/515. Multi-level voltage source 600 includes a power multiplexer (power MUX) 610 that receives reference voltages from a 12 volt source 620, an 8 volt source 630, a 5 volt source 640, and a 3 volt reference voltage source 700, and also receives two or more control signals 660. In response to control signals 660, power MUX 610 transmits either a 12 volt signal, an 8 volt signal, a 5 volt signal, a 3 volt signal, or a 0 volt signal to wordline drivers 415/515 via output line 670.

A detailed description of power MUX 610, 12 volt power source 620 and 8 volt reference source 630 and their operation is provided in U.S. Pat. No. 5,650,672, which is incorporated herein by reference.

Figure 7:
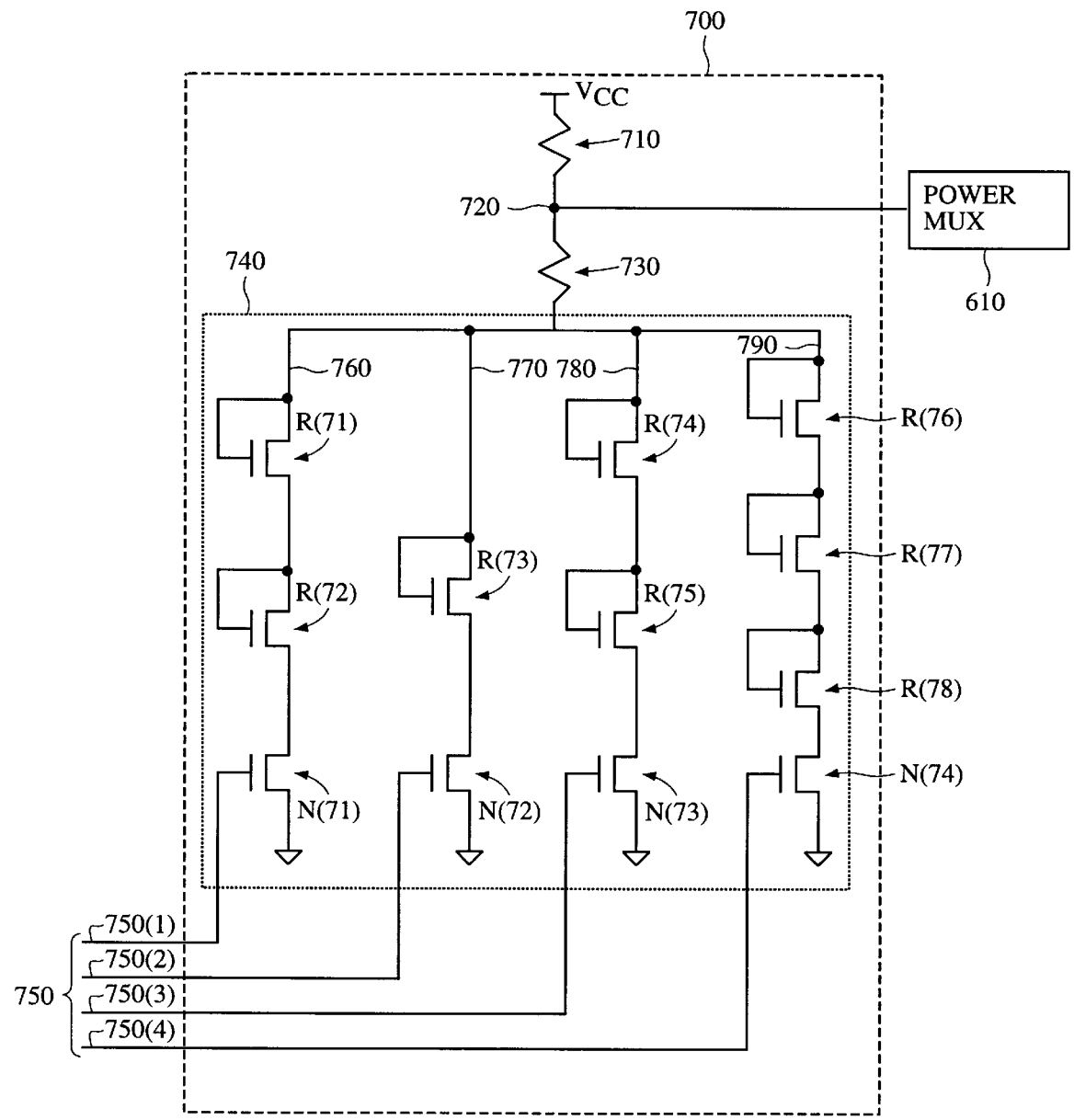
FIG. 7 is a simplified circuit diagram showing an enhanced blank check erase verify reference voltage source for generating wordline signals during a blank check operation in accordance with the present invention.

FIG. 7 is a circuit diagram illustrating reference voltage source 700 in accordance with the present invention. Reference voltage source 700 generates a predetermined output voltage (e.g., 3.5 to 4 volts) during a blank check operation of the memory cells associated with UIM 410 and AND array 510. Reference voltage source 700 includes a first resistor 710 (e.g., 20K Ohms) connected between Vcc (first voltage source) and an output node 720, a second resistor 730 (e.g., 30K Ohms) having a first terminal connected to output node 720, and a reference voltage adjustment circuit 740 connected between a second terminal of second resistor 730 and ground (second voltage source). Reference voltage adjustment circuit 740 selectively connects the second terminal of second resistor 730 to ground through one or more resistive elements in response to input signals 750 such that a reference voltage at output node 720 is equal to the predetermined reference voltage.

Reference voltage adjustment circuit 740 includes four resistance paths 760, 770, 780 and 790 that are connected between the second terminal of second resistor 730 and ground. Each resistance path includes at least one resistance element and a control switch that is controlled by one of the input signals 750. First resistive path 760 includes resistance elements R(71) and R(72), and is selectively connected to ground through first NMOS transistor N(71) in response to a first input signal 750(1). Second resistive path 770 includes resistance element R(73), and is selectively connected to ground through second NMOS transistor N(72) in response to a second input signal 750(2). Third resistive path 780 includes resistance elements R(74) and R(75), and is selectively connected to ground through third NMOS transistor N(73) in response to a third input signal 750(3). Fourth resistive path 790 includes resistance elements R(76), R(77) and R(78), and is selectively connected to ground through fourth NMOS transistor N(74) in response to a first input signal 750(4). The resistive elements R(71) through R(78) are formed such that resistance paths 760, 770, 780 and 790 produce different references voltages, thereby allowing adjustment of the reference voltage at output node 720 in response to variations in Vcc. In the present embodiment, each resistance element R(71) through R(78) is an NMOS device having its source and gate connected together. Other resistance element types may also be used. In one embodiment, resistance elements R(71) and R(72) have width-to-length ratios of 10/1, and resistance elements R(73) through R(78) have width-to-length ratios of 1.7/1. Therefore, in this embodiment, first resistance path 760 provides a resistance that is less than that of second resistance path 770, second resistance path 770 provides a resistance that is less than third resistance path 780, and third resistance path 780 provides a resistance that is less than that of fourth resistance path 790. The reference voltage at output node 720 is adjusted to different voltage levels by turning on one or more of the NMOS devices N(71) through N(74), thereby pulling down output node 720 through second resistor 730 and the resistance provided by the resistance path of the selected NMOS device.

Figure 3:
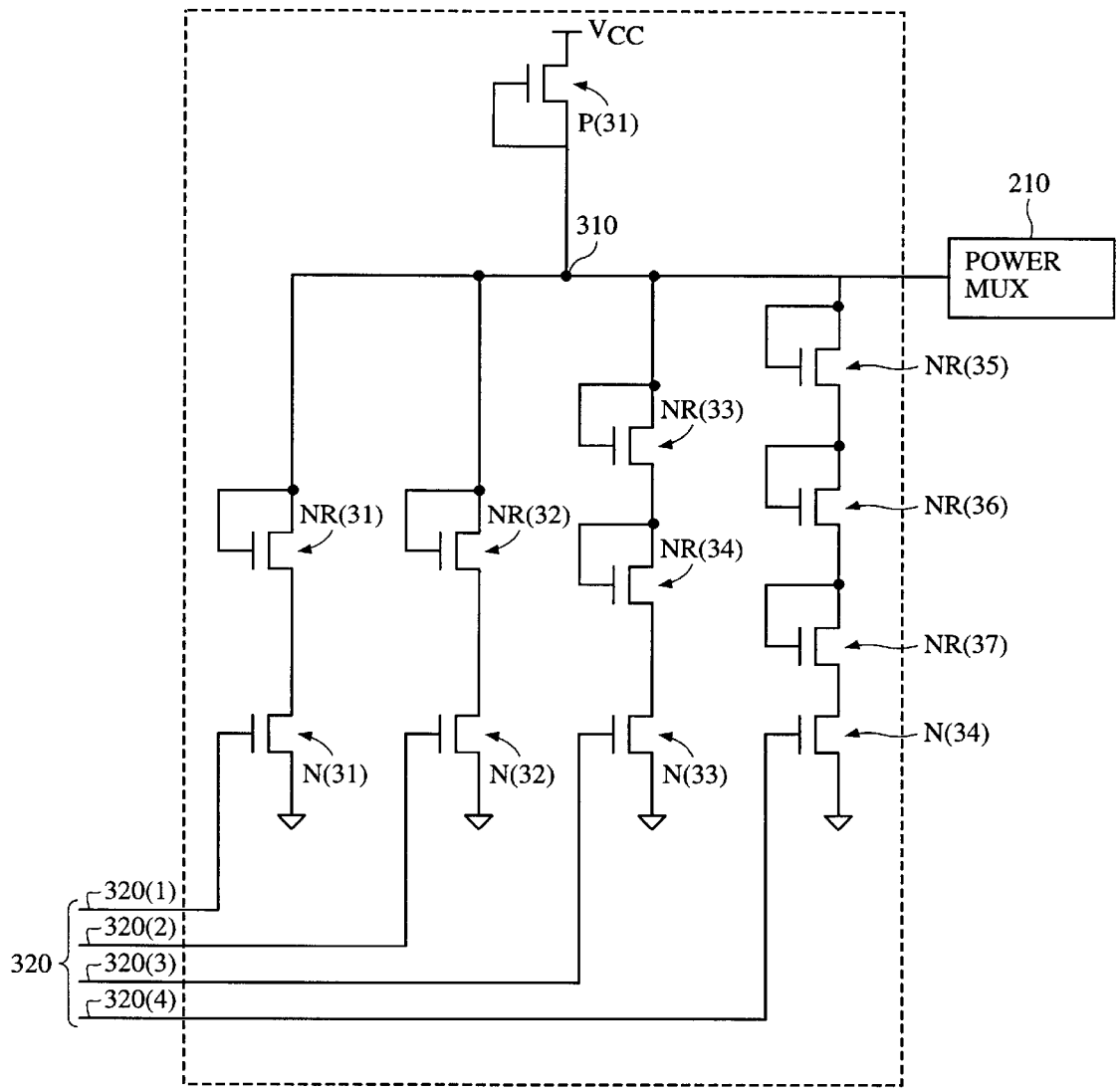
FIG. 3 is a simplified circuit diagram showing a prior art reference voltage source for generating wordline signals during a blank check operation.

Reference voltage source 700 uses a resistive divider formed by first resistor 710 and second resistor 730 that introduces a smaller voltage drop than that of PMOS device P(31) used in prior art reference voltage source 300 (discussed above in reference to FIG. 3), and is less sensitive to process corners and temperature variations. Specifically, the resistive divider is less sensitive to process corners because the first and second resistors 710 and 730 are formed during a single process step using the same resistive materials, whereas the PMOS device P(31) and NMOS devices of prior art reference voltage source 300 are produced in separate processes. Because the first and second resistors 710 and 730 are produced in a single step, any process variations in that step will be applied equally to both resistors. Further, temperature variations may produce different performance characteristics in the PMOS and NMOS devices of prior art reference voltage source 300. In contrast, the resistive divider is less sensitive to temperature variations because temperature-induced changes in first and second resistors 710 and 730 are substantially identical. As a result, reference voltage source 700 generates an output voltage that is higher and more stable for a given Vcc level than that of prior art reference voltage source 300, thereby allowing generation of the required 3.5 to 4 volt output voltage even when Vcc falls as low as 4.5 volts. This provides for reliable blank check operations in UIM 410 and/or in FBs 500 of CPLD 400, thereby increasing production yields. Further, the resistive divider produces an output voltage that tracks changes in Vcc, thereby causing the output voltage to change with the trip voltage of the sense amplifiers.

Although the invention is described herein with reference to the preferred embodiments, one skilled in the art will readily appreciate that other applications may be substituted for those set forth herein without departing from the spirit and scope of the present invention. As an example, while the embodiment disclosed herein teaches the use of NMOS resistive elements, those skilled in the art will recognize that other embodiments including resistors, PMOS devices, CMOS devices, and bipolar devices are variations of the present invention. Accordingly, the invention should only be limited by the claims included below.

We claim:

1. A reference voltage source for generating a predetermined reference voltage during a blank check operation, the circuit comprising:

a first resistor connected between a first voltage source and an output node;

a second resistor having a first terminal connected to the output node; and a reference voltage adjustment circuit connected between a second terminal of the second resistor and a second voltage source;

wherein said reference voltage adjustment circuit selectively connects the second resistor to the second voltage source through one or more of a plurality of resistive elements in response to one or more input signals such that a reference voltage at the output node is equal to the predetermined reference voltage.

2. The reference voltage source according to claim 1, wherein the reference voltage adjustment circuit comprises:

a first resistive path connected between the second terminal of the second resistor and the second voltage source, the first resistive path including a first transistor that connects the first resistive path to the second voltage source in response to a first input signal; and a second resistive path connected between the second terminal of the second resistor and the second voltage source, the second resistive path including a second transistor that connects the second resistive path to the second voltage source in response to a second input signal;

wherein the reference voltage at the output node is adjusted in response to the first and second input signals.

3. The reference voltage source according to claim 2, wherein the first resistive path further comprises a first resistive element formed by a transistor having a first terminal and a gate connected to the second terminal of the second resistor, and a second resistive element formed by a transistor having a first terminal and a gate connected to a second terminal of the first resistive element, and a second terminal connected to the first transistor;

wherein the second resistive path further comprises a third resistive element formed by a transistor having a first terminal and a gate connected to the second terminal of the second resistor, and a second terminal connected to the second transistor; and wherein each of the first resistive element and the second resistive element has a larger width-to-length ratio than that of the third resistive element.

4. The reference voltage source according to claim 3, wherein the reference voltage adjustment circuit further comprises:

a third resistive path connected between the second terminal of the second resistor and the second voltage source, the third resistive path including a third transistor that connects the third resistive path to the second voltage source in response to a third input signal, the third resistive path also including:

a fourth resistive element formed by a transistor having a first terminal, a second terminal and a gate, the first terminal and the gate being connected to the second terminal of the second resistor; and a fifth resistive element formed by a transistor having a first terminal, a second terminal and a gate, the first terminal and the gate being connected to the second terminal of the fourth resistive element, and the second terminal being connected to the third transistor;

wherein the third, fourth and fifth resistive elements have an equal resistance.

5. The reference voltage source according to claim 4, further comprising:

a fourth resistive path connected between the second terminal of the second resistor and the second voltage source, the fourth resistive path including a fourth transistor that connects the fourth resistive path to the second voltage source in response to a fourth input signal;

wherein the fourth resistive path further includes a sixth resistive element, an seventh resistive element and an eighth resistive element connected in series between the second resistor and the fourth transistor, each of the sixth resistive element, the seventh resistive element and the eighth resistive element being formed by a transistor having a gate connected to the fourth resistive path; and wherein the fourth transistor has a width-to-length ratio that is equal to that of each of the second and third transistors; and wherein each of the sixth, seventh and eighth resistive elements has a width-to-length ratio that is equal to that of each of the third, fourth and fifth resistive elements.

6. A programmable logic device comprising:

a programmable interconnect matrix including a plurality of word lines, a plurality of bit lines and a plurality of memory cells, each word line being connected to one of the bit lines through a memory cell;

a blank check circuit connected to the bit lines for verifying that the plurality of memory cells are erased;

a plurality of word line drivers, each word line driver generating a word line voltage on one of the plurality of word lines in response to an input voltage; and a reference voltage source for generating a predetermined reference voltage during a blank check operation, the reference voltage being utilized to generate the input voltage transmitted to the plurality of word line drivers, the reference voltage source comprising:

a first resistor connected between a first voltage source and an output node;

a second resistor having a first terminal connected to the output node; and a reference voltage adjustment circuit connected between a second terminal of the second resistor and a second voltage source;

wherein said reference voltage adjustment circuit selectively connects the second resistor to the second voltage source through one or more of a plurality of resistive elements in response to one or more input signals such that a reference voltage at the output node is equal to the predetermined reference voltage.

7. The programmable logic device according to claim 6, wherein the reference voltage adjustment circuit of the reference voltage source further comprises:

a first resistive path connected between the second terminal of the second resistor and the second voltage source, the first resistive path including a first transistor that connects the first resistive path to the second voltage source in response to a first input signal; and a second resistive path connected between the second terminal of the second resistor and the second voltage source, the second resistive path including a second transistor that connects the second resistive path to the second voltage source in response to a second input signal;

wherein the reference voltage at the output node is adjusted in response to the first and second input signals.

8. The programmable logic device according to claim 7, wherein the first resistive path further comprises a first resistive element formed by a transistor having a first terminal and a gate connected to the second terminal of the second resistor, and a second resistive element formed by a transistor having a first terminal and a gate connected to a second terminal of the first resistive element, and a second terminal connected to the first transistor;

wherein the second resistive path further comprises a third resistive element formed by a transistor having a first terminal and a gate connected to the second terminal of the second resistor, and a second terminal connected to the second transistor; and wherein each of the first resistive element and the second resistive element has a larger width-to-length ratio than that of the third resistive element.

9. The programmable logic device according to claim 8, wherein the reference voltage adjustment circuit further comprises:

a third resistive path connected between the second terminal of the second resistor and the second voltage source, the third resistive path including a third transistor that connects the third resistive path to the second voltage source in response to a third input signal, the third resistive path also including:

a fourth resistive element formed by a transistor having a first terminal, a second terminal and a gate, the first terminal and the gate being connected to the second terminal of the second resistor; and a fifth resistive element formed by a transistor having a first terminal, a second terminal and a gate, the first terminal and the gate being connected to the second terminal of the fourth resistive element, and the second terminal being connected to the third transistor; and wherein the third, fourth and fifth resistive elements have an equal resistance.

10. The programmable logic device according to claim 9, further comprising:

a fourth resistive path connected between the second terminal of the second resistor and the second voltage source, the fourth resistive path including a fourth transistor that connects the fourth resistive path to the second voltage source in response to a fourth input signal;

wherein the fourth resistive path further includes a sixth resistive element, an seventh resistive element and an eighth resistive element connected in series between the second resistor and the fourth transistor, each of the sixth resistive element, the seventh resistive element and the eighth resistive element being formed by a transistor having a gate connected to the fourth resistive path; and wherein the fourth transistor has a width-to-length ratio that is equal to that of each of the second and third transistors; and wherein each of the sixth, seventh and eighth resistive elements has a width-to-length ratio that is equal to that of each of the third, fourth and fifth resistive elements.

11. A programmable logic device comprising:

a function block including an AND array and a plurality of macrocells connected to receive product terms generated by the AND array, the AND array including a plurality of word lines, a plurality of bit lines and a plurality of memory cells, each word line being connected to one of the bit lines through a memory cell;

a blank check circuit connected to the bit lines for verifying that the plurality of memory cells are erased;

a plurality of word line drivers, each word line driver generating a word line voltage on one of the plurality of word lines in response to an input voltage; and a reference voltage source for generating a predetermined reference voltage during a blank erase verify procedure, the reference voltage being utilized to generate the input voltage transmitted to the plurality of word line drivers, the reference voltage source comprising:

a first resistor connected between a first voltage source and an output node;

a second resistor having a first terminal connected to the output node; and a reference voltage adjustment circuit connected between a second terminal of the second resistor and a second voltage source;

wherein said reference voltage adjustment circuit selectively connects the second resistor to the second voltage source through one or more of a plurality of resistive elements in response to one or more input signals such that a reference voltage at the output node is equal to the predetermined reference voltage.

12. The programmable logic device according to claim 11, wherein the reference voltage adjustment circuit of the reference voltage source further comprises:

a first resistive path connected between the second terminal of the second resistor and the second voltage source, the first resistive path including a first transistor that connects the first resistive path to the second voltage source in response to a first input signal; and a second resistive path connected between the second terminal of the second resistor and the second voltage source, the second resistive path including a second transistor that connects the second resistive path to the second voltage source in response to a second input signal;

wherein the reference voltage at the output node is adjusted in response to the first and second input signals.

13. The programmable logic device according to claim 12, wherein the first resistive path further comprises a first resistive element formed by a transistor having a first terminal and a gate connected to the second terminal of the second resistor, and a second resistive element formed by a transistor having a first terminal and a gate connected to a second terminal of the first resistive element, and a second terminal connected to the first transistor;

wherein the second resistive path further comprises a third resistive element formed by a transistor having a first terminal and a gate connected to the second terminal of the second resistor, and a second terminal connected to the second transistor; and wherein each of the first resistive element and the second resistive element has a larger width-to-length ratio than that of the third resistive element.

14. The programmable logic device according to claim 13, wherein the reference voltage adjustment circuit further comprises:

a third resistive path connected between the second terminal of the second resistor and the second voltage source, the third resistive path including a third transistor that connects the third resistive path to the second voltage source in response to a third input signal, the third resistive path also including:

a fourth resistive element formed by a transistor having a first terminal, a second terminal and a gate, the first terminal and the gate being connected to the second terminal of the second resistor; and a fifth resistive element formed by a transistor having a first terminal, a second terminal and a gate, the first terminal and the gate being connected to the second terminal of the fourth resistive element, and the second terminal being connected to the third transistor; and wherein the third, fourth and fifth resistive elements have an equal resistance.

15. The programmable logic device according to claim 14, further comprising:

a fourth resistive path connected between the second terminal of the second resistor and the second voltage source, the fourth resistive path including a fourth transistor that connects the fourth resistive path to the second voltage source in response to a fourth input signal;

wherein the fourth resistive path further includes a sixth resistive element, an seventh resistive element and an eighth resistive element connected in series between the second resistor and the fourth transistor, each of the sixth resistive element, the seventh resistive element and the eighth resistive element being formed by a transistor having a gate connected to the fourth resistive path; and wherein the fourth transistor has a width-to-length ratio that is equal to that of each of the second and third transistors; and wherein each of the sixth, seventh and eighth resistive elements has a width-to-length ratio that is equal to that of each of the third, fourth and fifth resistive elements.

* * * * *